United States Patent
Okamura et al.

(10) Patent No.: US 12,040,114 B2
(45) Date of Patent: Jul. 16, 2024

(54) MAGNETORESISTIVE DEVICE COMPRISING A SYNTHETIC ANTIFERROMAGNETIC COUPLING LAYER OF RuAl HAVING A (001) TEXTURE

(71) Applicant: Western Digital Technologies, Inc., San Jose, CA (US)

(72) Inventors: Susumu Okamura, San Jose, CA (US); James Mac Freitag, Sunnyvale, CA (US); Yuankai Zheng, Fremont, CA (US); Brian R. York, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 138 days.

(21) Appl. No.: 17/944,516

(22) Filed: Sep. 14, 2022

(65) Prior Publication Data
US 2024/0087785 A1 Mar. 14, 2024

(51) Int. Cl.
*H01F 10/32* (2006.01)
*G01R 33/09* (2006.01)
(Continued)

(52) U.S. Cl.
CPC ....... *H01F 10/3272* (2013.01); *G01R 33/093* (2013.01); *G01R 33/098* (2013.01);
(Continued)

(58) Field of Classification Search
None
See application file for complete search history.

(56) References Cited

U.S. PATENT DOCUMENTS 6,946,697 B2 9/2005 Pietambaram et al.
7,859,034 B2 12/2010 Huai et al.
(Continued)

FOREIGN PATENT DOCUMENTS

KR 20130008929 A 1/2013

OTHER PUBLICATIONS

Filippou, Panagiotis Ch. Et al., "Heusler-based synthetic antiferrimagnets", Science Advances, vol. 8, Issue 8, Feb. 2022, pp. 1-8, <https://www.science.org/doi/10.1126/sciadv.abg2469>.
(Continued)

*Primary Examiner* — Jas A Sanghera
(74) *Attorney, Agent, or Firm* — PATTERSON + SHERIDAN, LLP

(57) ABSTRACT

The present disclosure generally relates to magnetoresistive (MR) devices. The MR device comprises a synthetic antiferromagnetic (SAF) layer that increases stability to magnetic fields, and in turn, results in lower magnetic noise of the device. The MR device comprises a first ferromagnetic (FM1) layer and a second ferromagnetic (FM2) layer, in between which is an SAF spacer of RuAl alloy having a B2 crystalline structure with (001) texture, meaning that the (001) plane is parallel to the surface of MR device substrate. The first ferromagnetic (FM1) layer and a part of the second ferromagnetic (FM2) layer also have the (001) texture. An amorphous layer in a second ferromagnetic (FM2) layer can reset the growth texture of the MR device to a (111) texture in order to promote the growth of an antiferromagnetic (AF) pinning layer.

39 Claims, 10 Drawing Sheets

(51) Int. Cl.
*H10B 61/00* (2023.01)
*H10N 50/85* (2023.01)
*G11B 5/39* (2006.01)

(52) U.S. Cl.
CPC ............. *H10B 61/00* (2023.02); *H10N 50/85* (2023.02); *G11B 5/3906* (2013.01)

(56) References Cited

U.S. PATENT DOCUMENTS

| | | |
|---|---|---|
| 8,497,538 B2 | 7/2013 | Pietambaram et al. |
| 8,508,984 B2 | 8/2013 | Ranjan et al. |
| 9,099,124 B1 | 8/2015 | Freitag et al. |
| 2006/0218773 A1 | 10/2006 | Carey et al. |
| 2007/0015293 A1 | 1/2007 | Wang et al. |
| 2007/0111332 A1 | 5/2007 | Zhao et al. |
| 2007/0195592 A1 | 8/2007 | Yuasa |
| 2009/0257151 A1 | 10/2009 | Zhang et al. |
| 2013/0015539 A1 | 1/2013 | Choi |
| 2013/0107616 A1 | 5/2013 | Ohno et al. |
| 2015/0049594 A1* | 2/2015 | Kanbe .................. G11B 5/657 428/831 |
| 2017/0213957 A1 | 7/2017 | Hong et al. |
| 2018/0138397 A1 | 5/2018 | Lee et al. |
| 2020/0259076 A1* | 8/2020 | Filippou ................. H01F 1/408 |
| 2023/0084970 A1 | 3/2023 | Okamura et al. |

OTHER PUBLICATIONS

Veloso, Anabela et al., "Spin valve sensors with synthetic free and pinned layers", Journal of Applied Physics, Jun. 2000, pp. 1-12, <https://www.researchgate.net/publication/224489681_Spin_valve_sensors_with_synthetic_free_and_pinned_layers>.

Lee, Du-Yeong et al., "Effect of coupling ability between a syntheticantiferromagnetic layer and pinned layer on abridging layer of Ta, Ti, and Pt in perpendicular-magnetic tunnel junctions", Nanotechnology, vol. 27, No. 29, Jun. 2016, <https://pubmed.ncbi.nlm.nih.gov/27292593/>.

International Search Report and Written Opinion for International Application No. PCT/US2022/028238 dated Sep. 21, 2022.

* cited by examiner

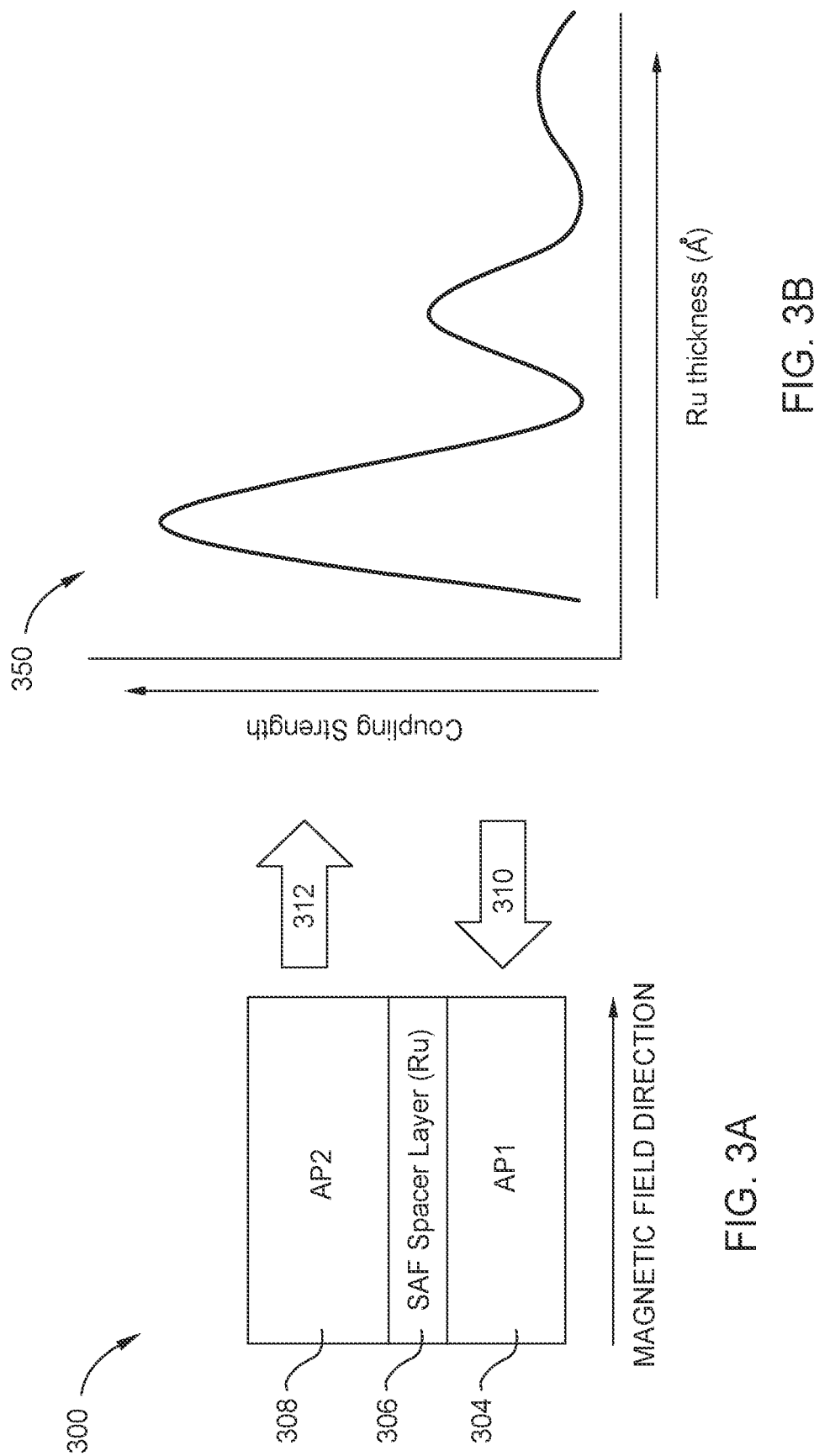

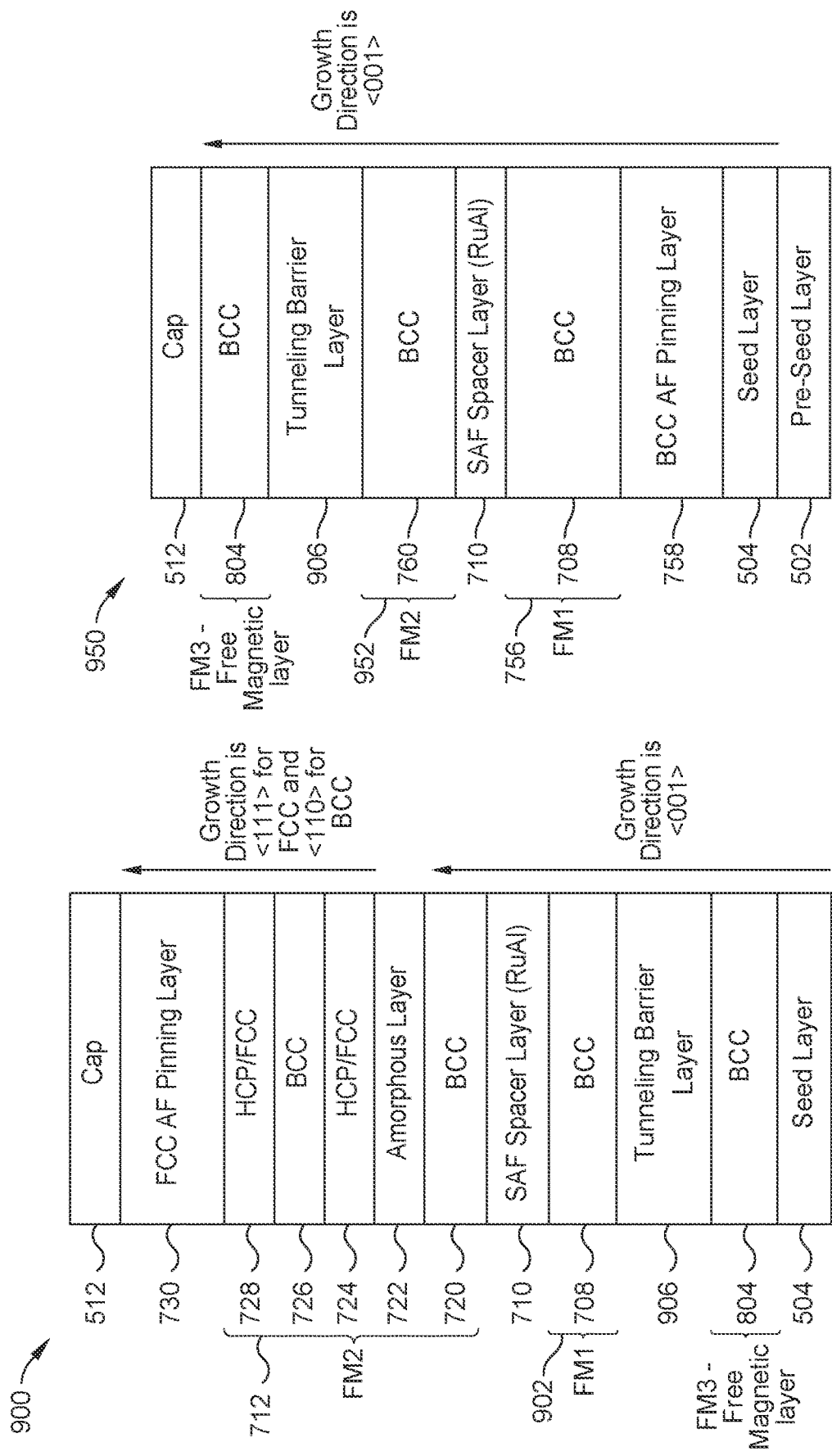

MAGNETORESISTIVE DEVICE COMPRISING A SYNTHETIC ANTIFERROMAGNETIC COUPLING LAYER OF RuAl HAVING A (001) TEXTURE

BACKGROUND OF THE DISCLOSURE

Field of the Disclosure

Embodiments of the present disclosure generally relate to magnetoresistive (MR) devices.

Description of the Related Art

Magnetoresistive (MR) devices are utilized in various ways in hard disk drives and memories, such as in magnetic recording heads, magnetic sensors, and magnetoresistive random access memory (MRAM) devices. MR devices generally comprise thin layers of magnetic and nonmagnetic metallic materials and insulating material in a spin-engineered stack, and the stacks may be based on giant magnetoresistive (GMR) effects and/or tunneling magnetoresistive (TMR) effects, for example. One challenge in building these stacks is to reduce, or more preferably eliminate, the magnetic dipole fields produced from the magnetic layers, with keeping high tolerance against temperature and magnetic fields.

Synthetic antiferromagnetic materials (SAFs) are used to address these challenges. SAFs are typically used in MR devices to control the magnetic state of the pinned layer. Generally, an overall SAF structure (also referred herein as SAF layer) includes antiferromagnetic coupled layers, where two ferromagnetic layers are separated by a transition metal spacer layer between thin ferromagnetic (FM) layers. The SAF layer has a reduced net magnetic moment. As a result, structures with SAF layers have the benefit of producing weak dipole magnetic fields to other ferromagnetic layers. SAF layer with stronger exchange coupling is desirable for overall MR device performance, but this conventionally involves tradeoffs in thermal stability. Thinner SAF spacer layers tend to produce stronger exchange coupling which in turn results in lower magnetic noise of the device. However, thin SAF spacer layers simultaneously reduce the thermal reliability of such devices. Some well-known materials for the SAF spacer layer such as Ru, Ir, and Cr tend to give stronger exchange coupling on close packed planes (e.g. HCP:0001, FCC:111, or BCC:110 textures) relative to other textures such as FCC/BCC:001 textures. However, MgO-based TMR devices and CPP-GMR with Heusler alloy ferromagnetic layers are usually fabricated with a 001 texture.

Therefore, there is a need in the art for better SAF spacer material to produce additional strong exchange coupling when used in a SAF layer with a (001) texture within a MR device.

SUMMARY OF THE DISCLOSURE

The present disclosure generally relates to magnetoresistive (MR) devices. The MR device comprises a synthetic antiferromagnetic (SAF) layer that increases stability to magnetic fields, and in turn, results in lower magnetic noise of the device. The MR device comprises a first ferromagnetic (FM1) layer and a second ferromagnetic (FM2) layer, in between which is an SAF spacer of RuAl alloy having a B2 crystalline structure with (001) texture, meaning that the (001) plane is parallel to the surface of MR device substrate. The first ferromagnetic (FM1) layer and a part of the second ferromagnetic (FM2) layer also have the (001) texture. An amorphous layer in a second ferromagnetic (FM2) layer can reset the growth texture of the MR device to a (111) texture in order to promote the growth of an antiferromagnetic (AF) pinning layer.

In one embodiment, a magnetoresistive (MR) device comprises a seed layer; a first ferromagnetic (FM1) layer disposed over the seed layer; a synthetic antiferromagnetic layer (SAF) spacer layer disposed on the FM1 layer; a second ferromagnetic (FM2) layer disposed on the SAF spacer layer; and a cap layer disposed over the FM2 layer. The SAF spacer layer comprises RuAl, has a (001) texture, and a total thickness in the range of about 7 Å to about 11 Å or about 18 Å to about 24 Å.

In another embodiment, a giant magnetoresistive (GMR) device comprising a pre-seed layer comprising an amorphous material; a (001) texture seed layer comprising RuAl disposed on the pre-seed layer; a free ferromagnetic layer disposed on the (001) texture seed layer; a first ferromagnetic (FM1) layer disposed over the free ferromagnetic layer; a synthetic antiferromagnetic layer (SAF) spacer layer disposed on the FM1 layer, wherein: the SAF spacer layer comprises RuAl, and the SAF spacer layer a total thickness in the range of about 7 Å to about 11 Å; and a second ferromagnetic (FM2) layer disposed on the SAF spacer layer.

In another embodiment, a tunneling magnetoresistive (TMR) device comprising a pre-seed layer comprising an amorphous material; a (001) texture seed layer comprising RuAl disposed on the pre-seed layer; a free ferromagnetic layer disposed on the (001) texture seed layer; a tunneling barrier layer disposed on the free ferromagnetic layer; a first ferromagnetic (FM1) layer disposed on the tunneling barrier layer; a synthetic antiferromagnetic layer (SAF) spacer layer disposed on the FM1 layer, wherein: the SAF spacer layer comprises RuAl, and the SAF spacer layer has a (001) texture; a second ferromagnetic (FM2) layer disposed on the SAF spacer layer; and a pinning layer disposed on the second ferromagnetic (FM2) layer.

In yet another embodiment, a tunneling magnetoresistive (TMR) device comprises a pre-seed layer comprising an amorphous material; a (001) texture seed layer comprising RuAl disposed on the pre-seed layer; a pinning layer disposed on the (001) texture seed layer; a first ferromagnetic (FM1) layer disposed on the pinning layer; a synthetic antiferromagnetic layer (SAF) spacer layer disposed on the FM1 layer, wherein: the SAF spacer layer comprises RuAl, and the SAF spacer layer has a (001) texture; and a second ferromagnetic (FM2) layer disposed on the SAF spacer layer; a tunneling barrier layer disposed on the second ferromagnetic (FM2) layer; and a free ferromagnetic layer disposed on the tunneling barrier layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3A is a cross-sectional view illustrating a conventional SAF layer.

FIG. 3B is a diagram illustrating the relationship between coupling strength and Ru thickness (Å) in a conventional SAF layer.

FIG. 9A is a schematic cross-sectional view of a top pinned tunneling magnetoresistive (TMR) sensor device, according to another embodiment.

FIG. 9B is a schematic cross-sectional view of a bottom pinned TMR sensor device, according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to magnetoresistive (MR) devices. The MR device comprises a synthetic antiferromagnetic (SAF) layer that increases stability to magnetic fields, and in turn, results in lower magnetic noise of the device. The MR device comprises a first ferromagnetic (FM1) layer and a second ferromagnetic (FM2) layer, in between which is an SAF spacer of RuAl alloy having a B2 crystalline structure with (001) texture, meaning that the (001) plane is parallel to the surface of MR device substrate. The first ferromagnetic (FM1) layer and a part of the second ferromagnetic (FM2) layer also have the (001) texture. An amorphous layer in a second ferromagnetic (FM2) layer can reset the growth texture of the MR device to a (111) texture in order to promote the growth of an antiferromagnetic (AF) pinning layer.

The MR devices disclosed in various embodiments may be used in magnetic recording heads in magnetic recording devices such as hard disk drives and tape drives. The MR devices can also be used in magneto-resistive random access memory (MRAM) cells and magnetic sensors. Certain disclosed embodiments include such magnetic recording heads, magnetic recording devices, MRAM cells, and magnetic sensors incorporating the MR devices. For example, TMR devices in magnetic recording heads and MRAM cells are further described in co-owned U.S. patent application Ser. No. 17/472,019 filed Sep. 10, 2021, titled "Tunnel Magnetoresistive (TMR) Device with Improved Seed Layer," which is hereby incorporated by reference.

Figure 1:
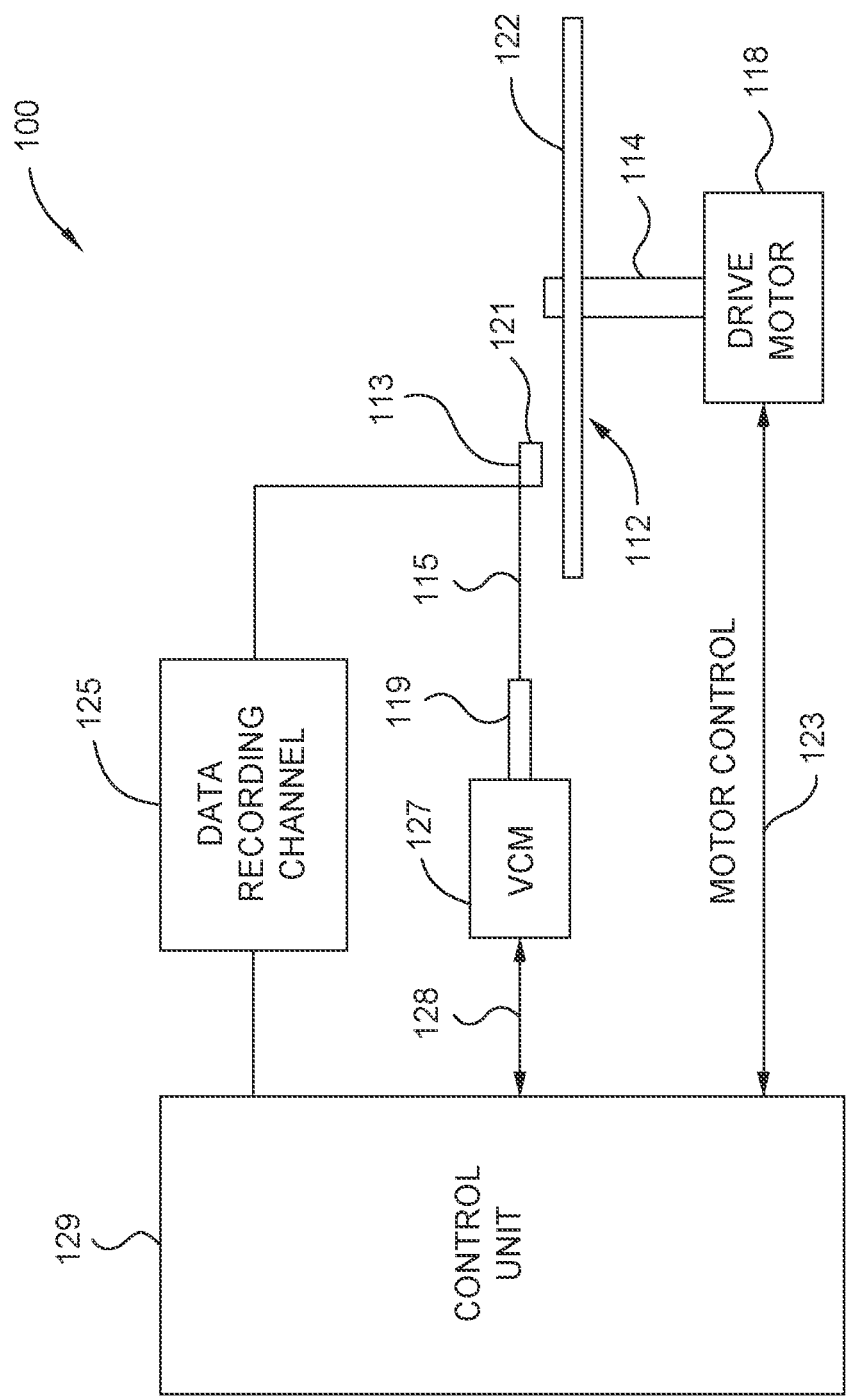
FIG. 1 illustrates a schematic illustration of a magnetic recording device, according to one embodiment.

FIG. 1 illustrates a disk drive 100 embodying this disclosure. As shown, at least one rotatable magnetic media 112 is supported on a spindle 114 and rotated by a disk drive motor 118. The magnetic recording on each disk is in the form of any suitable patterns of data tracks, such as annular patterns of concentric data tracks (not shown) on the magnetic media 112.

At least one slider 113 is positioned near the magnetic media 112, each slider 113 supporting one or more magnetic head assemblies 121. As the magnetic media rotates, the slider 113 moves radially in and out over the media surface 122 so that the magnetic head assembly 121 may access different tracks of the magnetic media 112 where desired data are written. Each slider 113 is attached to an actuator arm 119 by way of a suspension 115. The suspension 115 provides a slight spring force which biases the slider 113 toward the media surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic media 112 generates an air bearing between the slider 113 and the media surface 122 which exerts an upward force or lift on the slider 113. The air bearing thus counterbalances the slight spring force of suspension 115 and supports slider 113 off and slightly above the media 112 surface by a small, substantially constant spacing during normal operation. In the case of EAMR, a DC magnetic field generated from an assist element of the magnetic head assembly 121 enhances the write-ability so that the write element of the magnetic head assembly 121 may efficiently magnetize the data bits in the media 112.

The various components of the disk drive 100 are controlled in operation by control signals generated by control unit 129, such as access control signals and internal clock signals. Typically, the control unit 129 comprises logic control circuits, storage means, and a microprocessor. The control unit 129 generates control signals to control various system operations, such as drive motor control signals on line 123 and head position and seek control signals on line 128. The control signals on line 128 provide the desired current profiles to optimally move and position slider 113 to the desired data track on media 112. Write and read signals are communicated to and from write and read heads on the assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2:
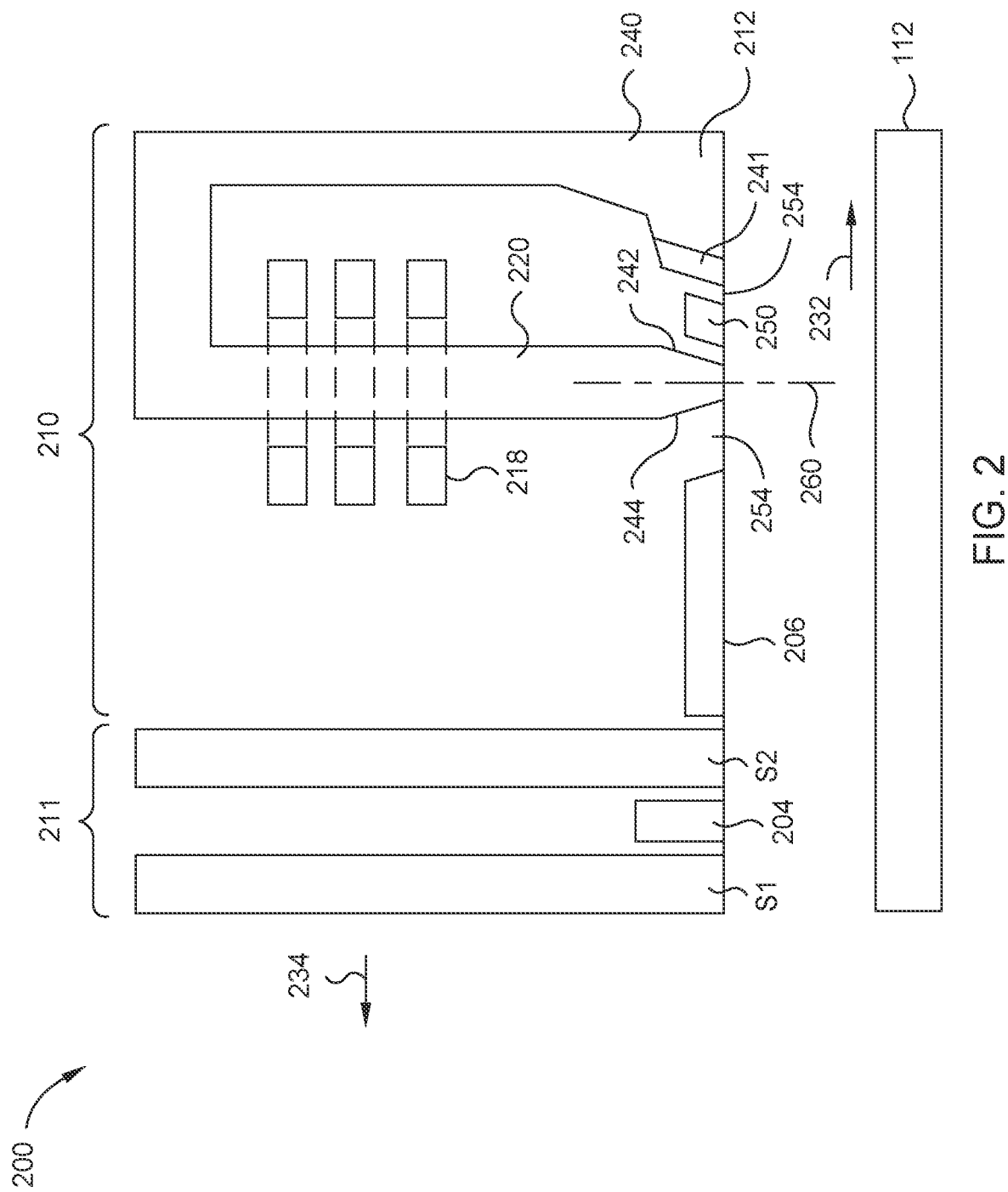
FIG. 2 is a fragmented, cross-sectional side view through the center of a read/write head facing a magnetic media, according to one embodiment.

FIG. 2 is a fragmented, cross sectional side view through the center of a read/write head 200 facing the magnetic media 112, according to one embodiment. The read/write head 200 may correspond to the magnetic head assembly 121 described in FIG. 1. The read/write head 200 includes a media facing surface (MFS) 212, such as an air bearing surface (ABS), a magnetic write head 210, and a magnetic read head 211, and is mounted such that the MFS 212 is facing the magnetic media 112. The read/write head 200 may be an energy-assisted magnetic recording (EAMR) head. In FIG. 2, the magnetic media 112 moves past the write head 210 in the direction indicated by the arrow 232 and the read/write head 200 moves in the direction indicated by the arrow 234.

In some embodiments, the magnetic read head 211 is a MR read head that includes an MR sensing element 204 (such as the various MR devices disclosed) located between MR shields S1 and S2. In other embodiments, the magnetic read head 211 is a magnetic tunnel junction (MTJ) read head that includes a MTJ sensing element 204 located between MR shields S1 and S2. The magnetic fields of the adjacent magnetized regions in the magnetic media 112 are detectable by the MR (or MTJ) sensing element 204 as the recorded bits.

The write head 210 includes a return pole 206, a main pole 220, a trailing shield 240, and a coil 218 that excites the main pole 220. The coil 218 may have a "pancake" structure which winds around a back-contact between the main pole 220 and the return pole 206, instead of a "helical" structure shown in FIG. 2. A trailing gap (not shown) and a leading gap (not shown) may be in contact with the main pole and a leading shield (not shown) may be in contact with the leading gap. A recording magnetic field is generated from the main pole 220 and the trailing shield 240 helps making the magnetic field gradient of the main pole 220 steep. The main pole 220 may be a magnetic material such as an FeCo alloy. The main pole 220 may include a trailing surface 222 which may be parallel to a leading surface 236 of the trailing shield 240. The main pole 220 may be a tapered write pole (TWP) with a trailing edge taper (TET) configuration. In one embodiment, the main pole 220 has a saturated magnetization (Ms) of 2.4 T and a thickness of about 300 nanometers (nm). The main pole 220 may comprise ferromagnetic materials, typically alloys of one or more of Co, Fe and Ni. The trailing shield 240 may be a magnetic material such as NiFe alloy. In one embodiment, the trailing shield 240 has an Ms of about 1.2 T to about 1.6 T.

It is to be understood that the embodiments discussed herein are applicable to a data storage device such as a hard disk drive (HDD) as well as a tape drive such as a tape embedded drive (TED) or an insertable tape media drive such as an LTO drive. An example TED is described in co-pending patent application titled "Tape Embedded Drive," U.S. Pat. No. 10,991,390, issued Apr. 27, 1921, assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

FIG. 3A is a schematic cross-sectional view of a conventional SAF layer 300 having an antiparallel (AP) pinned structure comprising a first antiparallel coupled ferromagnetic (AP1) layer 304, a SAF spacer layer 306 disposed on the AP1 layer 304, and a second antiparallel coupled (AP2) layer 308 disposed on the SAF spacer layer 306. The AP1 layer 304 and AP2 layer 308 are antiferromagnetically coupled across the SAF spacer layer 306. The SAF spacer layer 306 comprises well-known materials such as Ru, Ir, Rh, or Cr, or alloys thereof. In this example, the SAF spacer layer 306 is a Ru alloy.

Due to the antiparallel coupling across the SAF spacer layer 306, the ferromagnetic AP2 layer 308 and AP1 layer 304 have their respective magnetizations 312, 310 oriented antiparallel to each other. As a result, the net magnetization of the AP2 layer 308 and AP1 layer 304 is so small that a demagnetizing field induced by a flux closure structure is substantially minimized, and thus it becomes feasible for the read head to operate optimally. AP1 layer 304 and AP2 layer 308 may each be a single or multilayered structures.

FIG. 3B is a diagram 350 illustrating the relationship between coupling strength and Ru thickness (Å) in an SAF structure of the SAF layers 300 of FIG. 3A. As shown in the diagram 350, the coupling strength of the SAF spacer layer 306 increases as the thickness of the SAF spacer layer 306 decreases. However, the reliability of the SAF spacer layer 306 decreases as the thickness of the SAF spacer layer 306 decreases. Thus, thinner SAF spacer layers 306 have less reliability and less stability. While thicker SAF spacer layers 306 are more robust and stable, thicker SAF spacer layers 306 have a reduced coupling strength. As such, there is a tradeoff between coupling strength and reliability with a SAF spacer layer 306. Furthermore, well-known materials for the SAF spacer layer, such as Ru, are not suitable for 001 textured MR devices, such as fully epitaxial MgO-TMR and Heusler-based CPP-GMR devices with 001 texture. The SAF spacer layers do not grow well on BCC (001) texture which results in insufficient coupling fields, and in turn, have low coupling strength.

It has surprisingly been discovered that RuAl is an effective structure for the SAF spacer layer. RuAl SAF spacer layers give the strongest coupling strength at around 7 Å to about 10 Å, and much larger coupling strength than Ru SAF spacer on 001 textured underlayers. RuAl is an intermetallic compound and forms a B2 crystalline structure. FIG. 4A illustrates a 3-dimensional lattice of the RuAl compound. This B2 crystalline structure is extremely stable, is easily obtained when deposited, and grows well on BCC (001) texture. For at least these reasons, RuAl can be utilized as a SAF spacer layer material in MR structures without the tradeoff between coupling strength and reliability.

Figure 4B:
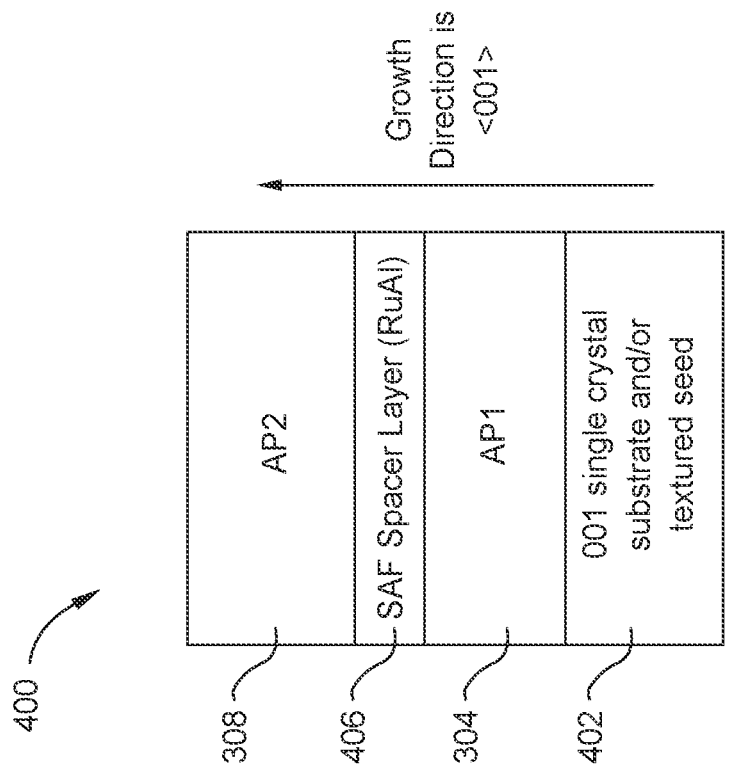
FIG. 4B is a schematic cross-sectional view illustrating a 001-textured SAF layer, according to one embodiment.
Figure 4A:
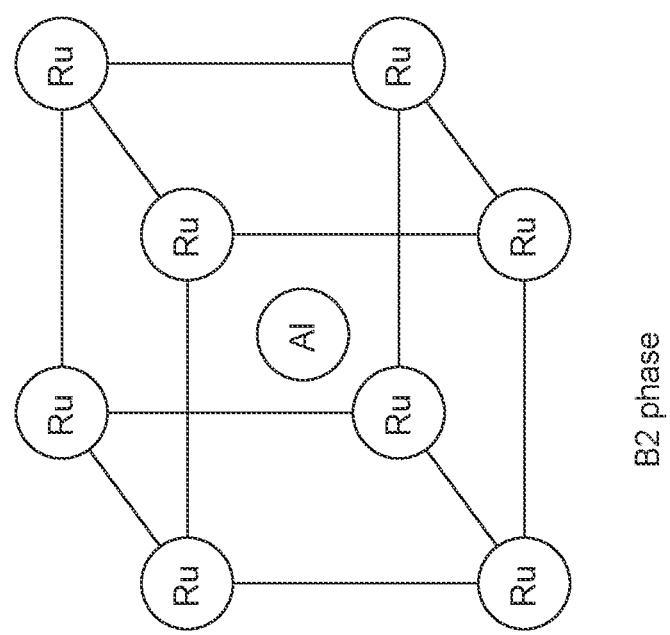
FIG. 4A is a schematic view of the B2 phase crystalline structure of RuAl.

FIG. 4B is schematic cross-sectional view of an AP-pinned structure 400, according to an embodiment of the disclosure. The AP-pinned structure 400 comprises a (001) textured seed layer 402, the AP1 layer 304 disposed on the (001) textured seed layer 402, a SAF spacer layer 406 disposed on the AP1 layer 304, and the AP2 layer 308 disposed on the SAF spacer layer 406. The (001) textured seed layer 402 may alternatively be a (001) texture single crystal substrate (e.g. MgO). The AP-pinned structure 400 grows epitaxial with the (001) texture of the (001) textured seed 402, as indicated by the arrow. The SAF spacer layer 406 and the (001) textured seed layer 402 may each individually comprise RuAl. The SAF spacer layer 406 has a thickness of about 7 Å to about 11 Å.

Figure 5:
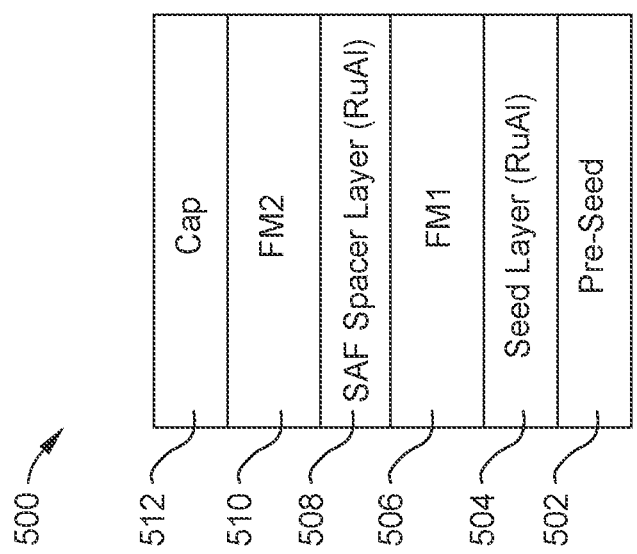
FIG. 5 is a schematic cross-sectional view of a layer stack with a 001-textured SAF layer with an improved RuAl SAF and seed layer, according to one embodiment.

FIG. 5 is a schematic cross-sectional view of layer stack 500 with a SAF layer having an improved SAF spacer layer and seed layer, according to one embodiment of the disclosure. Layer stack 500 may be utilized in a MR device according to various embodiments. The layer stack 500 may be utilized with the AP-pinned structure 400 of FIG. 4B. The layer stack 500 comprises a pre-seed layer 502 disposed on a suitable substrate or shield (not shown), a seed layer 504 disposed on the pre-seed layer 502, the first ferromagnetic (FM1) layer 506 disposed on the seed layer 504, the SAF spacer layer 508 disposed on the FM1 layer 506, the second ferromagnetic (FM2) layer 510 disposed on the SAF spacer layer 508, and the cap layer 512 disposed on the FM2 layer 510. The SAF spacer layer 508 may be the SAF spacer layer 406 of FIG. 4B, the FM1 layer 506 may be the AP1 layer 304 of FIG. 4B, and the AP2 layer 308 of FIG. 4B.

Figure 6:
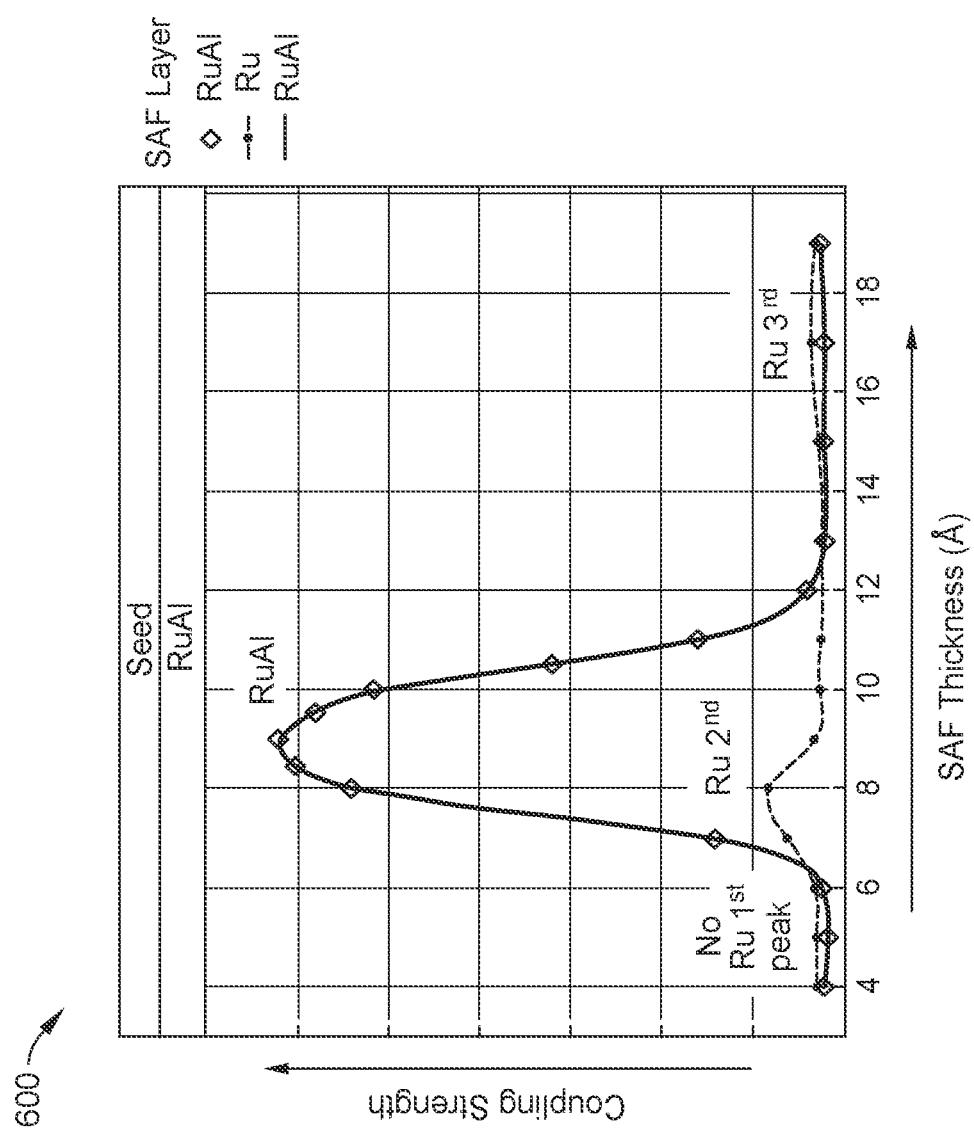
FIG. 6 is a diagram comparing coupling strength relative to the thickness of a SAF layers comprising Ru versus a SAF layer comprising RuAl.

The electrically conductive amorphous pre-seed layer 502 may be a single layer or multilayer comprising one or more materials selected from the group consisting of a NiFeTa alloy, a CoFeTa alloy, a CoFeB alloy, a CoFeBTa alloy, and Ta, with a total thickness in the range of about 5 Å to about 50 Å, such as about 30 Å. The electrically conductive seed layer 504 comprises RuAl or an alloy thereof, and forms a B2 crystalline structure with a (001) texture, i.e., the (001) plane is parallel to the surfaces of the pre-seed layer 502 and the substrate. The RuAl seed layer 504 has a total thickness in the range of about 5 Å to about 50 Å, such as about 30 Å. The SAF spacer layer 508 comprises RuAl or an alloy thereof. In the present embodiment, the total thickness of the SAF layer 508 is in the range of about 7 Å to about 11 Å, such as about 9 Å, or about 18 Å to about 24 Å. The SAF spacer layer 508 in such a thickness range shows strong AP coupling and is strongest at about 9 Å, even with the (001) texture, as shown in FIG. 6. The non-magnetic cap layer 512 may be a Ru/Ta/Ru multilayer. The cap layer 512 protects the FM layers 506, 510 from chemical and mechanical damages during processing, so that the FM layers maintain strong ferromagnetic properties.

The FM1 layer 506 and the FM2 layer 510 each individually comprises a suitable material with a BCC structure that can inherit the (001) texture of the seed layer 504. Suitable materials with BCC structures that can inherit the (001) texture of the seed layer 504 include a CoFe alloy, a CoFeNi-based alloy, Heusler alloys such as $Co_2MnSi$, $Co_2MnAl$, $Co_2MnGe$, $Co_2FeSi$, and $Co_2FeAl$, and half-Heusler alloys such as NiMnSb, or more generally, Heusler alloys with B2 DO3, C1b, and L21 structures. The FM1 layer 506 and the FM2 layer 510 each individually has a thickness in the range of about 10 Å to about 80 Å, such as about 30 Å, and can also be multilayered.

FIG. 6 is a diagram 600 comparing coupling strength relative to the thickness of the SAF layers comprising Ru, such as the SAF layers 300 of FIG. 3A, versus SAF layers comprising RuAl, such as the SAF layers 500 of FIG. 5. As shown in the diagram 600, at a similar thickness, the coupling strength of a RuAl SAF spacer layer is greater than that of a Ru SAF spacer layer. Moreover, RuAl SAF layers provide strong coupling strength with thick SAF spacer layer thickness resulting in better reliability.

FIGS. 7A-9B illustrate various embodiments of pinned SAF structures and MR devices 700-950. As such, aspects of the MR devices 700-950 of FIGS. 7A-9B may be used in combination with one another. Moreover, one or more of the MR devices 700-950 of FIGS. 7A-9B may comprise the same layers or sublayers, which serve the same function or purpose within each device.

Figures 7A, 7B:
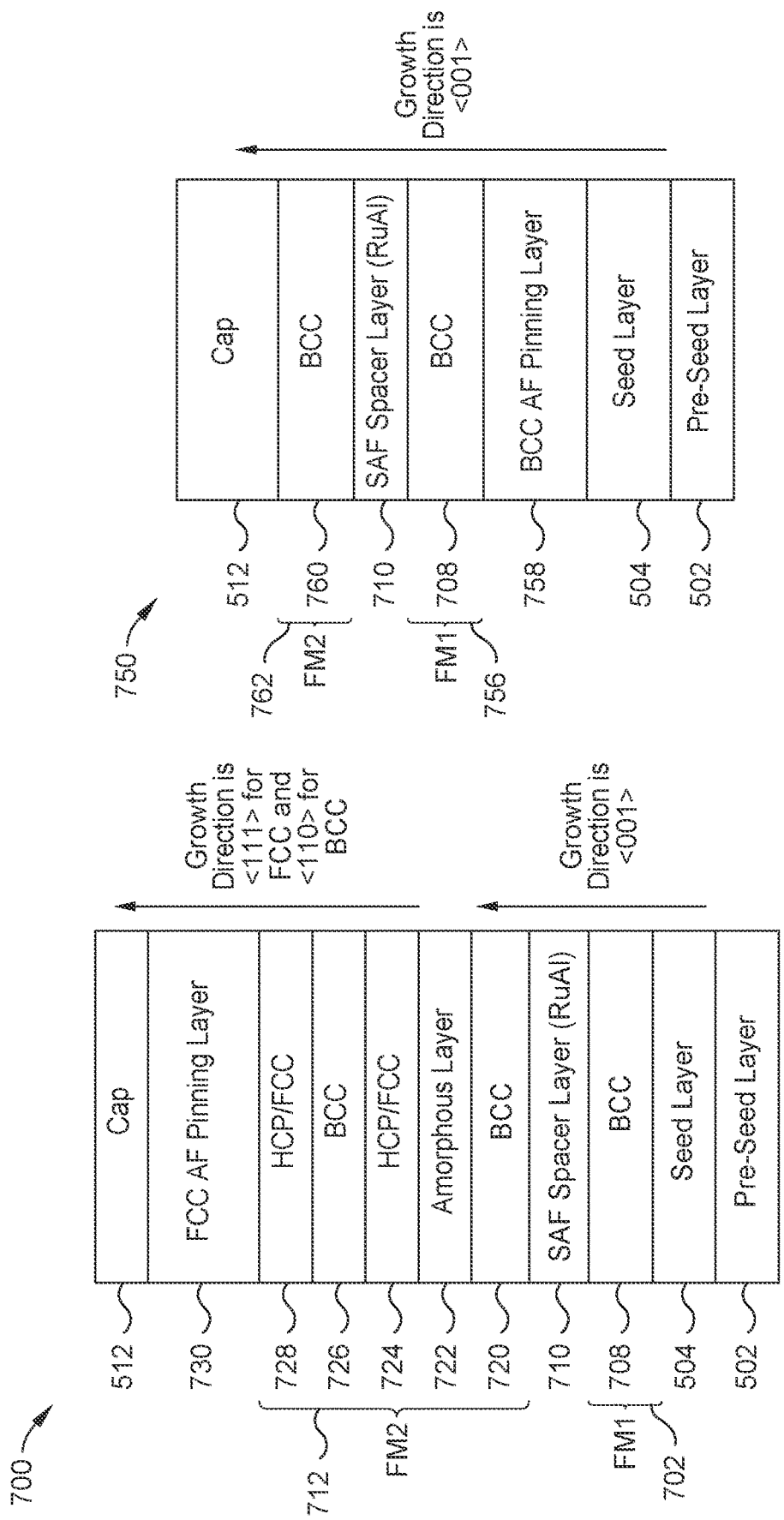
FIG. 7A is a schematic cross-sectional view of a top pinned structure with a 001-textured RuAl-SAF layer, according to another embodiment.
FIG. 7B is a schematic cross-sectional view of a bottom pinned structure with a 001-textured SAF layer RuAl-SAF layer, according to one embodiment.

FIG. 7A is a schematic cross-sectional view of a top pinned structure 700 comprising a RuAl SAF spacer layer, according to an embodiment of the disclosure. The top pinned structure 700 comprises a suitable substrate or shield (not shown), the pre-seed layer 502 disposed on the substrate or shield, the seed layer 504 disposed on the pre-seed layer 502, a first ferromagnetic (FM1) layer 702 disposed on the seed layer 504, a SAF spacer layer 710 disposed on the FM1 layer 702, a second ferromagnetic (FM2) layer 712 disposed on the SAF spacer layer 710, an antiferromagnetic pinning layer 730 disposed on the FM2 712, and the cap layer 512 disposed on the FM2 layer 712.

In the present embodiment, the FM1 layer 702 comprises a first BCC layer 708. The first BCC layer 708 comprises CoFe or an alloy thereof, and has a total thickness of about 30 Å. The SAF spacer layer 710 comprises RuAl or an alloy thereof, and has a total thickness of about 9.5 Å. The composition of RuAl is $Ru_xAl_y$, where x and y are atomic percentages (y is equal to 100-x) and y is in a range of about 40 to 55, such as about 44. The FM2 layer 712 is a multilayer structure comprising a second BCC sublayer 720 disposed on the SAF spacer layer 710, an amorphous sublayer 722 disposed on the second BCC sublayer 720, a first HCP/FCC sublayer 724 disposed on the amorphous sublayer 722, a third BCC sublayer 726 disposed on the first HCP/FCC sublayer 724, a second HCP/FCC sublayer 728 disposed on the third BCC sublayer 726, and a FCC AF pinning layer 730 disposed on the second HCP/FCC sublayer 728.

The second BCC sublayer 720 comprises CoFe or an alloy thereof, with a total thickness of about 12 Å. The amorphous sublayer 722 comprises CoFeBTa or an alloy thereof, and has a total thickness of about 10 Å. The first HCP/FCC sublayer 724 comprises Co or an alloy thereof, and has a total thickness of about 10 Å. The third BCC sublayer 726 comprises CoFe or an alloy thereof, and has a total thickness of about 10 Å. The second HCP/FCC sublayer 728 comprises Co or an alloy thereof, and has a thickness of about 3 Å. The FCC AF pinning layer 730 comprises IrMn or an alloy thereof, and has a total thickness of about 60 Å. Since well-known materials for AF pinning layers (such as IrMn) require a (111) texture to grow, the amorphous sublayer 722 is inserted into the stack to promote the (111) growth of the AF pinning layer 730 by resetting the texture of the structure 700 from a <001> direction with (001) texture to a FCC <111>/HCP <0001> direction with FCC (111)/HCP (0001) texture and BCC <110> direction with (110) texture, as indicated by the arrows. The amorphous sublayer 722 serves the same purpose in the MR device 800 of FIG. 8A and the MR device 900 of FIG. 9A.

The FM1 layer 702 and the FM2 layer 712 each individually comprises a suitable material with a BCC structure that can inherit the (001) texture of the seed layer 504. Other suitable materials with BCC structures that can inherit the (001) texture of the seed layer 504 include a CoFe alloy, a CoFeNi-based alloy, Heusler alloys such as $Co_2MnSi$, $Co_2MnAl$, $Co_2MnGe$, $Co_2FeSi$, and $Co_2FeAl$, and half- Heusler alloys such as NiMnSb, or more generally, Heusler alloys with B2 DO3, C1b, and L21 structure.

FIG. 7B is a schematic cross-sectional view of a bottom pinned structure 750 comprising a RuAl SAF layer, according to an embodiment of the disclosure. The bottom pinned RuAl SAF layer sensor device 750 comprises a substrate or shield (not shown), the pre-seed layer 502 disposed on the substrate or shield, the seed layer 504 disposed on the pre-seed layer 502, a BCC-type structured antiferromagnetic material 758 disposed on the seed layer 504, a FM1 layer 756 disposed on the BCC-type AF pinning layer 758, the SAF spacer layer 710 disposed on the FM1 layer 756, a FM2 layer 762 disposed on the SAF spacer layer 710, and the cap layer 512 disposed on the FM2 layer 762.

In the present embodiment, the BCC-type AF sublayer 758 may comprise any suitable BCC-type AF pinning material. The FM2 layer 762 comprises the second BCC sublayer 760 which has a total thickness of about 30 Å. The first BCC layer 708 has a total thickness of about 30 Å.

The FM1 layer 756 and the FM2 layer 762 each individually comprises a suitable material with a BCC structure that can inherit the (001) texture of the seed layer 504. Other suitable materials with BCC structures that can inherit the (001) texture of the seed layer 504 include a CoFe alloy, a CoFeNi-based alloy, Heusler alloys such as $Co_2MnSi$, $Co_2MnAl$, $Co_2MnGe$, $Co_2FeSi$, and $Co_2FeAl$, and half-Heusler alloys such as NiMnSb, or more generally, Heusler alloys with B2 DO3, C1b, and L21 structure. Each layer of the sensor device 750 has a (001) texture.

Figures 8A, 8B:
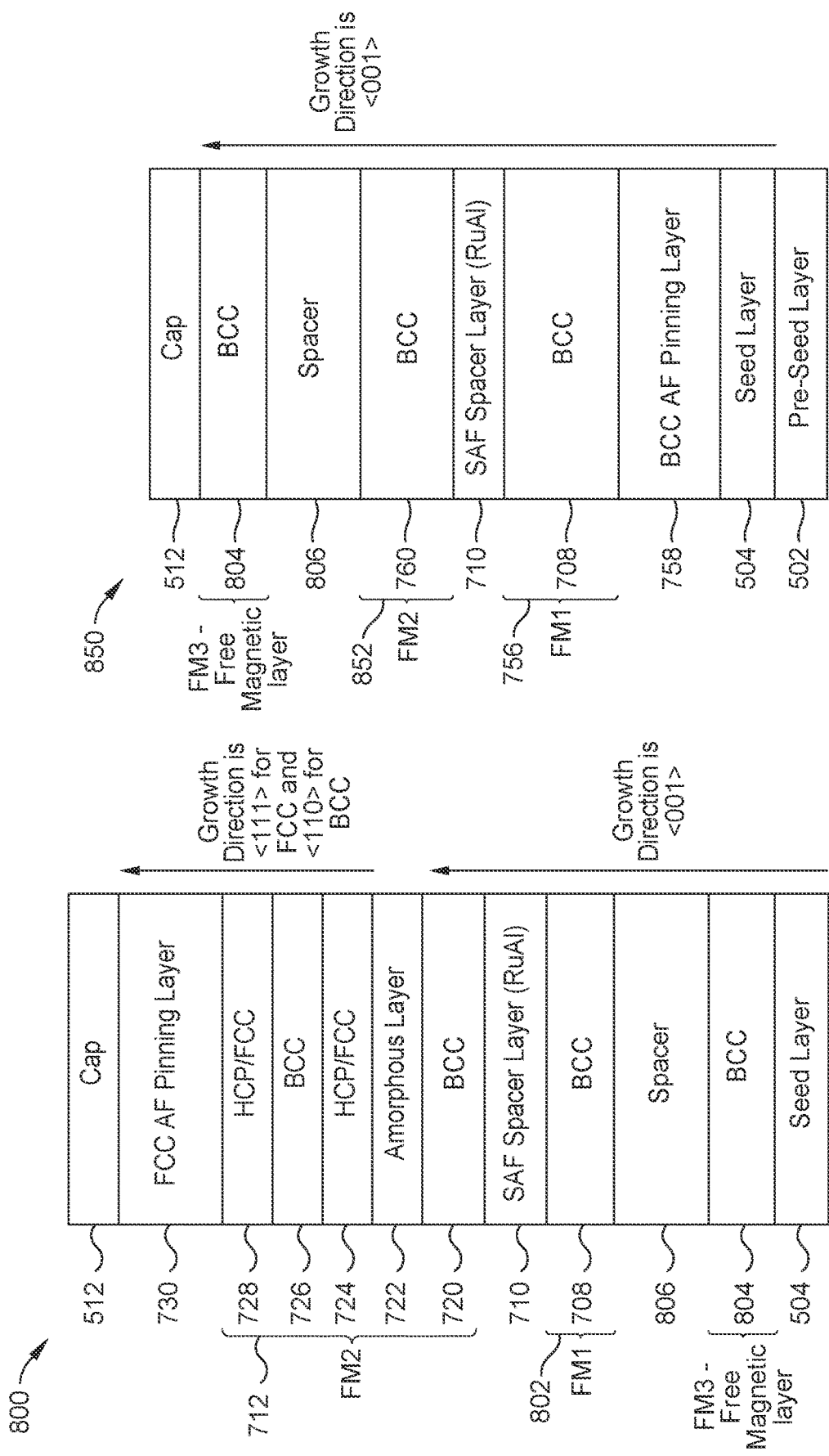
FIG. 8A is a schematic cross-sectional view of a top pinned giant magnetoresistive (GMR) sensor device, according to yet another embodiment.
FIG. 8B is a schematic cross-sectional view of a bottom pinned GMR sensor device, according to one embodiment.

FIG. 8A is a schematic cross-sectional view of a top pinned GMR device 800, according to one embodiment of the disclosure. The top pinned GMR device 800 comprises a suitable substrate or shield (not shown), the pre-seed layer 502 disposed on the substrate, the seed layer 504 disposed on the pre-seed layer 502, a FM3 layer 804 disposed on the seed layer 504, a GMR spacer layer 806 disposed on the FM3 layer 804, the FM1 layer 802 disposed on the GMR spacer layer 806, the SAF spacer layer 710 disposed on the FM1 layer 802, the FM2 layer 712 disposed on the SAF spacer layer 710, the FCC AF pinning layer 730 disposed on the FM2 layer 712, and the cap layer 512 disposed on the FCC AF pinning layer 730. The FM2 layer 712 is a multilayer structure comprising a second BCC sublayer 720 disposed on the SAF spacer layer 710, an amorphous sublayer 722 disposed on the second BCC sublayer 720, a first HCP/FCC sublayer 724 disposed on the amorphous sublayer 722, a third BCC sublayer 726 disposed on the first HCP/FCC sublayer 724, and a second HCP/FCC sublayer 728 disposed on the third BCC sublayer 726.

The FM3 layer 804 comprises a suitable ferromagnetic, BCC material as the first BCC sublayer that can inherit the (001) texture of the seed layer 504. The GMR spacer layer 806 comprises Cu and/or an Ag based material. The FM1 layer 802 comprises the second BCC sublayer 708 disposed on the GMR spacer 806. The magnetic free FM3 layer 804 is free to rotate in a plane parallel to the surfaces of the seed layer 504 and the substrate or shield (not shown) in response to transverse external magnetic fields, such as from a recording disk or other recorded magnetic media, or from other sources when used as a magnetic sensor.

Since the magnetic free FM3 layer 804 is free to rotate in response to transverse external magnetic fields, when a sense current flows through the stack (in a y direction), the magnetization rotation of the free FM3 layer 804 will lead to the variation of the angle between the magnetizations of the FM1 layer 802 and the free FM3 layer 804, which is detectable as the change in electrical resistance. The GMR sensor device 800 may be a current in plane (CIP) or a current perpendicular to plane (CPP) GMR device.

FIG. 8B is a schematic cross-sectional view of a bottom pinned GMR device 850, according to an embodiment of the disclosure. The bottom pinned GMR device 850 comprises a suitable substrate or shield (not shown), the pre-seed layer 502 disposed on the substrate, the seed layer 504 disposed on the pre-seed layer 502, the BCC-type antiferromagnetic layer 758 disposed on the seed layer 504, the FM1 layer 756 disposed on BCC-type antiferromagnetic layer 758, the SAF spacer layer 710 disposed on the FM1 layer 756, a FM2 layer 852 disposed on the SAF spacer layer 710, a GMR spacer layer 806 disposed on the FM2 layer, a free ferromagnetic layer 804, and the cap layer 512 disposed on the FM3 layer 804. The FM1 layer 756 comprises a first BCC sublayer 708 disposed on the BCC-type AF layer 758. The BCC-type AF layer 758 may comprise any suitable BCC-type AF material.

The FM2 layer 852 comprises the second BCC sublayer 760 disposed on the SAF spacer layer 710. The GMR spacer layer 806 and the FM3 layer 804 of the GMR sensor device 850 can have any texture. The FM3 layer 804 can be composed of multiple magnetic sublayers.

FIG. 9A is a schematic cross-sectional view of a top pinned tunneling magnetoresistive (TMR) device 900, according to an embodiment of the disclosure. In a pinned-type TMR device, either FM1 or FM2 has its magnetization fixed or pinned while the magnetically free FM3 layer has its magnetization free to rotate in the presence of an external magnetic field. The pinned ferromagnetic layer is called the reference layer because its magnetization is prevented from rotation. The magnetization of the reference layer can be fixed or pinned by being formed of a high-coercivity film or by being exchange-coupled to an AF pinning layer. The pinned-type TMR device can be used as memory cells in an MRAM device. The orientation of the magnetization of the free ferromagnetic layer can be modified using a spin-polarized current to have an orientation either parallel or antiparallel to the fixed magnetization of the reference, thereby generating two resistance levels representing a 1 (parallel) or 0 (antiparallel) as a bit.

The top pinned TMR device 900 comprises a suitable substrate or shield (not shown), the pre-seed layer 502 disposed on the substrate, the seed layer 504 disposed on the pre-seed layer 502, a magnetically free FM3 layer 804 disposed on the seed layer 504, a tunneling barrier layer 906 disposed on the FM3 layer, a FM1 layer 902 disposed on the tunneling barrier layer 906, the SAF spacer layer 710 disposed on the FM1 layer 902, the FM2 layer 712 disposed on the SAF spacer layer 710, the FCC antiferromagnetic pinning layer 730 disposed on the FM2 layer 712, and the cap layer 512 disposed on the antiferromagnetic pinning layer 730. The FM2 layer 712 is a multilayer structure comprising a second BCC sublayer 720 disposed on the SAF spacer layer 710, an amorphous sublayer 722 disposed on the second BCC sublayer 720, a first HCP/FCC sublayer 724 disposed on the amorphous sublayer 722, a third BCC sublayer 726 disposed on the first HCP/FCC sublayer 724, and a second HCP/FCC sublayer 728 disposed on the third BCC sublayer 726.

The tunneling barrier sublayer 906 grows epitaxial with the (001) texture on the FM3 layer 804, as indicated by the arrow. The tunneling barrier sublayer 906 comprises MgO or other materials that can function as tunneling barriers and can inherit the (001) texture of the FM3 layer 804, such as ZnO, MnO, CoO, TiO, and VO, as well as spinel materials such as $MgAl_2O_4$ and $MgGa_2O_4$.

FIG. 9B is a schematic cross-sectional view of a bottom pinned TMR device 950, according to an embodiment of the disclosure. The bottom pinned TMR device 950 comprises a suitable substrate or shield (not shown), the pre-seed layer 502 disposed on the substrate, the seed layer 504 disposed on the pre-seed layer 502, a BCC-type antiferromagnetic layer 758 disposed on the seed layer 504, the FM1 layer 756 disposed on the BCC-type antiferromagnetic layer 758, the SAF spacer layer 710 disposed on the FM1 layer 756, a FM2 layer 952 disposed on the SAF spacer layer 710, a tunneling barrier layer 906 disposed on the FM2 layer 952, a magnetically free FM3 layer 804 disposed on the tunneling barrier layer 906, and the cap layer 512 disposed on the FM3 layer 804. The FM1 layer 756 comprises a first BCC layer 708 disposed on the BCC-type AF layer 758. The BCC-type AF layer 758 may comprise any suitable BCC-type AF material.

The FM2 layer 952 comprises the second BCC sublayer 760 disposed on the SAF spacer layer 710. The FM3 layer of the TMR device 950 has a (001) texture at least near tunneling barrier layer 906.

Figure 10:
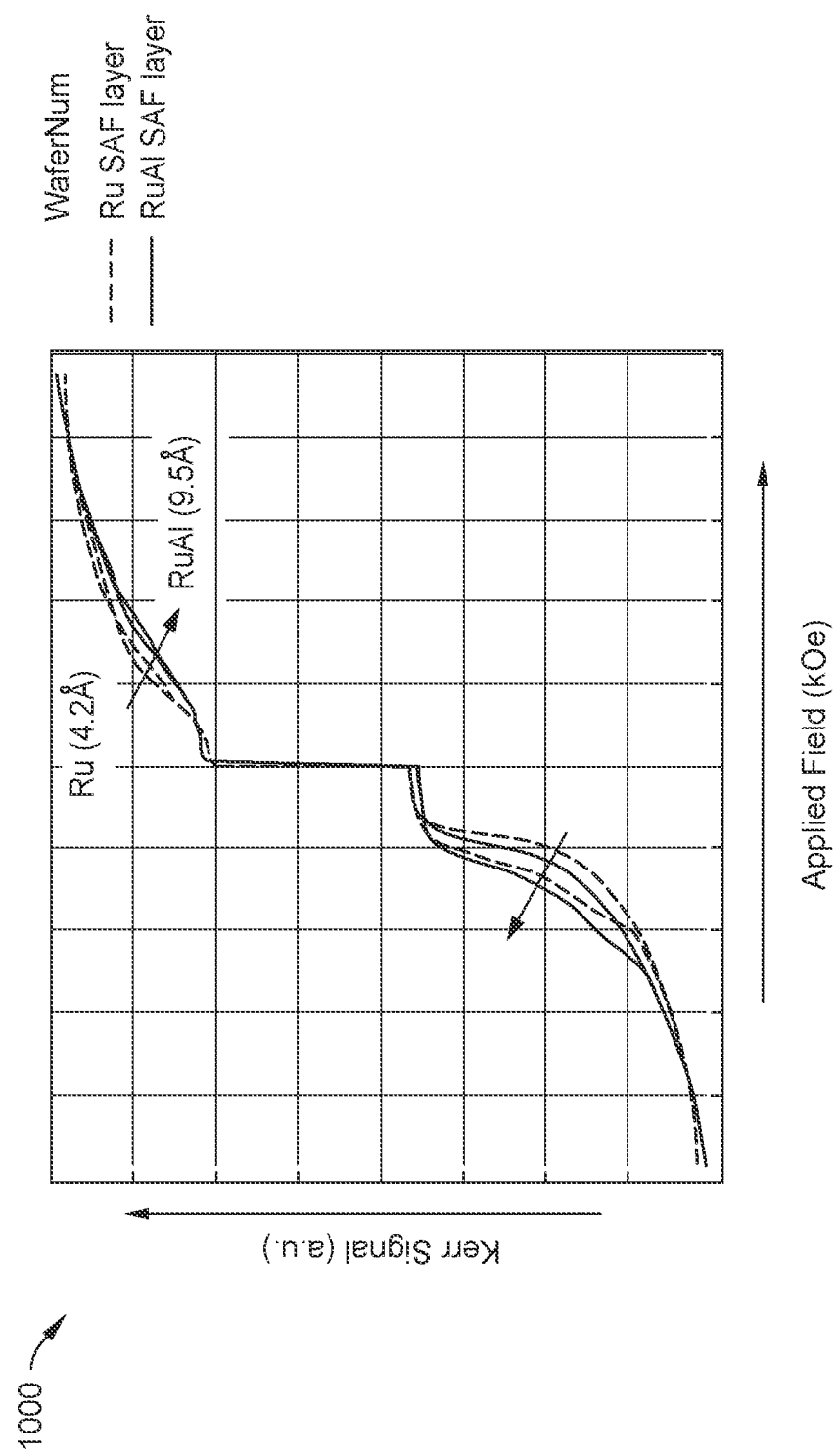
FIG. 10 is a diagram comparing Kerr Signal (a.u.) relative to the applied field (kOe) for materials Ru and RuAl.

FIG. 10 is a diagram 1000 utilizing the Kerr Effect to measure the Kerr Signal (a.u.) relative to the applied field (kOe) of top pinned structures, such as the devices 700, 800, and 900 of FIGS. 7A, 8A, and 9A, respectively, having Ru or RuAl SAF layers. As shown by diagram 1000, a top pinned structure utilizing a RuAl SAF layer, e.g. top pinned TMR sensor 900 of FIG. 9A, produces a stronger SAF coupling strength than even the $1^{st}$ peak of a top pinned structure utilizing a Ru SAF layer.

Figures 11A, 11B:
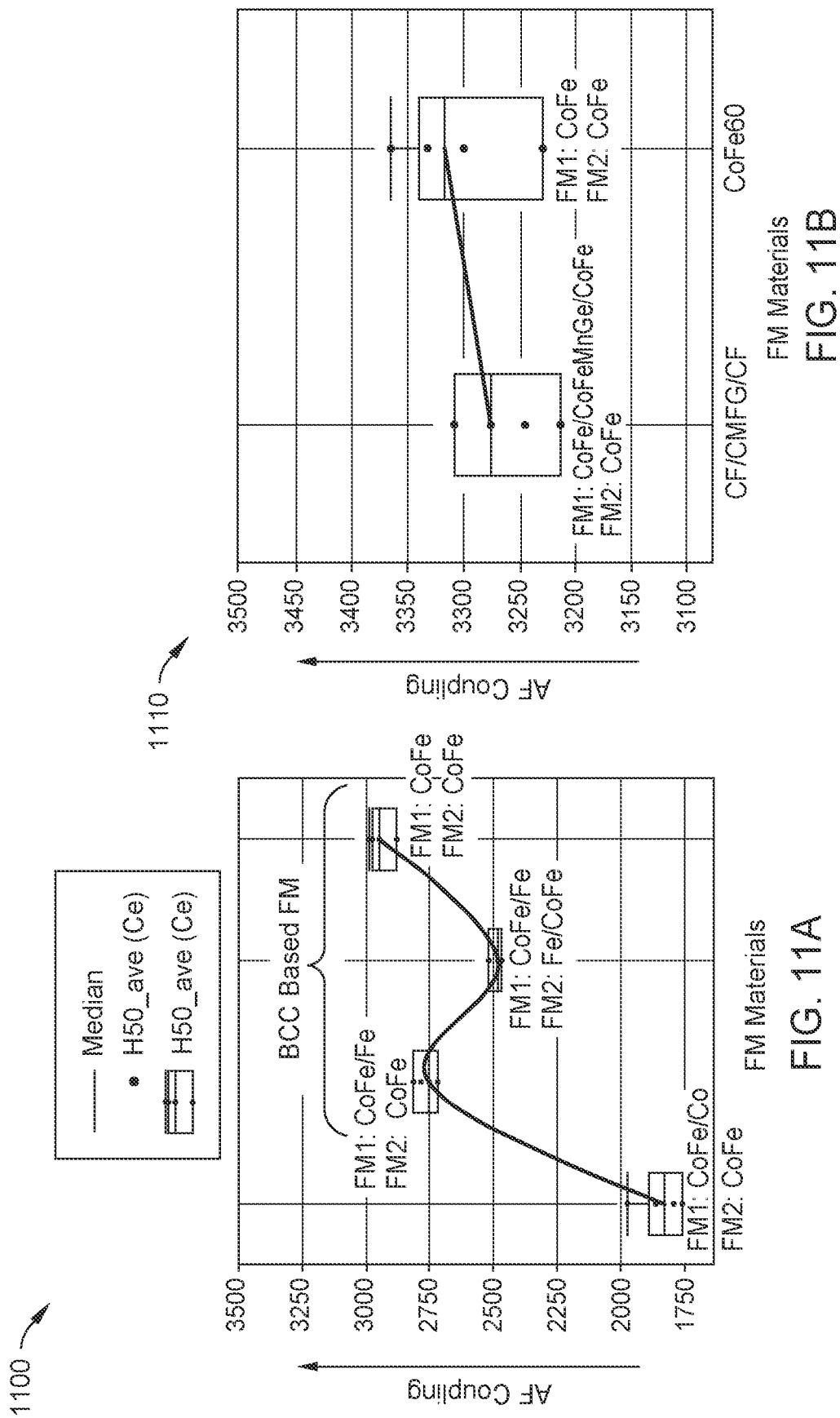
FIGS. 11A-11B illustrate the effect different FM materials have on AF coupling.

FIG. 11A is a diagram 1100 illustrating the effect BCC based FM materials, HCP based FM materials, and/or FCC based FM materials have on AF coupling, which may be utilized as the FM1 and/or FM2 layers in the devices 700-950 of FIGS. 7A-9B. As shown in diagram 1100, BCC based FM layer tend to produce stronger AF coupling effects relative to HCP or even FCC based FM layers.

FIG. 11B is a diagram 1110 illustrating the effect different combinations of the materials of diagram 1100 of FIG. 11A in the FM layers have on AF coupling. As shown in diagram 1110, FM layers that comprise a bcc based material, such as CoFeMnGe, give comparable AF coupling strength to FM layers that use CoFe.

Relative to conventional means, use of RuAl in the SAF spacer layer in a wide range of MR devices remedies many of the challenges in building such stacks. First, RuAl improves thermal stability which reduces the degradation of the AF coupling strength mainly due to the thick RuAl layer with strong coupling strength, and in turn, increases the reliability of such devices. Second, RuAl is grown effectively epitaxial with the (001) texture, which in turn improves coupling field effects in such devices.

In one embodiment, a magnetoresistive (MR) device comprises a seed layer; a first ferromagnetic (FM1) layer disposed on the seed layer; a synthetic antiferromagnetic layer (SAF) spacer layer disposed over the FM1 layer; a second ferromagnetic (FM2) layer disposed on the SAF spacer layer; and a cap layer disposed over the FM2 layer. The SAF spacer layer comprises RuAl, has a (001) texture, and a total thickness in the range of about 7 Å to about 11 Å, or about 18 Å to about 24 Å.

The SAF spacer layer has a B2 structure. The SAF structure further comprises a BCC-type antiferromagnetic layer disposed between the seed layer and the FM1 layer. The FM1 layer is a (001) texture BCC-based layer. The MR device further comprises a pre-seed layer disposed adjacent to the seed layer, and a cap layer disposed over the FM2 layer. The FM2 layer comprises at least one BCC-based sublayer disposed in contact with the SAF spacer layer, the at least one BCC-based sublayer comprising a Heusler alloy. The FM2 layer further comprises: at least one HCP/FCC-based layer disposed over the at least one BCC-based layer, and an amorphous layer between the at least one BCC-based layer and the at least one HCP/FCC-based layer. The MR device further comprises a FCC antiferromagnetic pinning layer disposed between the at least one HCP/FCC-based layer and the cap layer. The seed layer comprises RuAl and has a (001) texture. The MR device is one of a current in plane (CIP) giant magnetoresistive (GMR) device, a current perpendicular to plane (CPP) GMR device, or a tunneling magnetoresistive (TMR) device. A magnetic recording head comprises the MR device. A magnetic recording device comprises the magnetic recording head. A magneto-resistive random access memory (MRAM) comprises the MR device. A sensor comprises the MR device.

In another embodiment, a giant magnetoresistive (GMR) device comprises a pre-seed layer comprising an amorphous material; a (001) texture seed layer comprising RuAl disposed on the pre-seed layer, a free ferromagnetic layer disposed on the (001) texture seed layer; a first ferromagnetic (FM1) layer disposed over the free ferromagnetic layer; a synthetic antiferromagnetic layer (SAF) spacer layer disposed on the FM1 layer, wherein: the SAF spacer layer comprises RuAl, and the SAF spacer layer a total thickness in the range of about 7 Å to about 11 Å; and a second ferromagnetic (FM2) layer disposed on the SAF spacer layer.

The FM2 layer comprises at least one BCC-based sublayer, at least one HCP/FCC sublayer, and an amorphous layer. The GMR device further comprises a GMR spacer layer disposed between the free ferromagnetic layer and the FM1 layer, and a FCC antiferromagnetic pinning layer disposed over the FM2 layer. The GMR device further comprises a GMR spacer layer disposed between the free ferromagnetic layer and the FM2 layer, and a BCC-type antiferromagnetic layer disposed between the seed layer and the FM1 layer. The FM1 layer comprises at least one BCC-based layer, the at least one BCC-based layer comprising a Heusler alloy or a half-Heusler alloy. The Heusler alloy is selected from a group consisting of: $Co_2MnSi$, $Co_2MnAl$, $Co_2MnGe$, $Co_2FeSi$, and $Co_2FeAl$. The SAF layer has a (001) texture. A sensor comprises the GMR device.

In another embodiment, a tunneling magnetoresistive (TMR) device comprises a pre-seed layer comprising an amorphous material; a (001) texture seed layer comprising RuAl disposed on the pre-seed layer; a free ferromagnetic layer disposed on the (001) texture seed layer; a tunneling barrier layer disposed on the free ferromagnetic layer; a first ferromagnetic (FM1) layer disposed on the tunneling barrier layer; a synthetic antiferromagnetic layer (SAF) spacer layer disposed on the FM1 layer, wherein: the SAF spacer layer comprises RuAl, and the SAF spacer layer has a (001) texture; a second ferromagnetic (FM2) layer disposed on the SAF spacer layer; and a pinning layer disposed on the second ferromagnetic (FM2) layer.

The SAF layer has a thickness about 7 Å to about 11 Å. The FM1 layer comprises at least one BCC-based layer, the at least one BCC-based layer comprising a Heusler alloy or a half-Heusler alloy. The FM2 layer comprises: at least one BCC-based sublayer, at least one HCP/FCC sublayer, an amorphous layer, and an antiferromagnetic (AF) pinning sublayer. The amorphous material of the pre-seed layer is selected from a group consisting of: a NiFeTa alloy, a CoFeTa alloy, a CoFeB alloy, a CoFeBTa alloy, and Ta. The tunneling barrier layer comprises MgO. The pinning layer is a FCC antiferromagnetic pinning layer. A magnetic recording head comprises the TMR device. A magnetic recording device comprises the magnetic recording head. A magneto-resistive random access memory (MRAM) comprises the TMR device. A sensor comprises the TMR device.

In yet another embodiment, a tunneling magnetoresistive (TMR) device comprises a pre-seed layer comprising an amorphous material; a (001) texture seed layer comprising RuAl disposed on the pre-seed layer; a pinning layer disposed on the (001) texture seed layer; a first ferromagnetic (FM1) layer disposed on the pinning layer; a synthetic antiferromagnetic layer (SAF) spacer layer disposed on the FM1 layer, wherein: the SAF spacer layer comprises RuAl, and the SAF spacer layer has a (001) texture; and a second ferromagnetic (FM2) layer disposed on the SAF spacer layer; a tunneling barrier layer disposed on the second ferromagnetic (FM2) layer; and a free ferromagnetic layer disposed on the tunneling barrier layer.

The pinning layer is a BCC-type antiferromagnetic layer. The FM1 layer is a BCC-based layer, and wherein the FM2 layer is a BCC-based layer. The SAF spacer layer has a thickness about 7 Å to about 11 Å. A magnetic recording head comprises the TMR device. A magnetic recording device comprises the magnetic recording head. A magneto-resistive random access memory (MRAM) comprises the TMR device. A sensor comprises the TMR device.

While the foregoing is directed to embodiments of the present disclosure, other and further embodiments of the disclosure may be devised without departing from the basic scope thereof, and the scope thereof is determined by the claims that follow.

What is claimed is:

1. A magnetoresistive (MR) device comprising:
   a seed layer;
   a first ferromagnetic (FM1) layer disposed over the seed layer;
   a synthetic antiferromagnetic layer (SAF) spacer layer disposed on the FM1 layer, wherein:
   the SAF spacer layer comprises RuAl,
   the SAF spacer layer has a (001) texture, and
   the SAF spacer layer has a total thickness in the range of about 7 Å to about 11 Å, or about 18 Å to about 24 Å;
   a second ferromagnetic (FM2) layer disposed on the SAF spacer layer.

2. The MR device of claim 1, wherein the SAF spacer layer has a BCC structure.

3. The MR device of claim 1, further comprising a BCC-type antiferromagnetic layer disposed between the seed layer and the FM1 layer.

4. The MR device of claim 1, wherein the FM1 layer is a (001) texture BCC-based layer.

5. The MR device of claim 1, further comprising:
   a pre-seed layer disposed adjacent to the seed layer; and
   a cap layer disposed over the FM2 layer.

6. The MR device of claim 1, wherein the FM2 layer comprises at least one BCC-based layer disposed in contact with the SAF spacer layer, the at least one BCC-based layer comprising a Heusler alloy.

7. The MR device of claim 6, wherein the FM2 layer further comprises:
   at least one HCP/FCC-based layer disposed over the at least one BCC-based layer; and
   an amorphous layer between the at least one BCC-based layer and the at least one HCP/FCC-based layer.

8. The MR device of claim 7, further comprising a FCC antiferromagnetic pinning layer disposed between the at least one HCP/FCC-based layer and the cap layer.

9. The MR device of claim 1, wherein the seed layer comprises RuAl and has a (001) texture.

10. The MR device of claim 1 wherein the MR device is one of a current in plane (CIP) giant magnetoresistive (GMR) device, a current perpendicular to plane (CPP) GMR device, or a tunneling magnetoresistive (TMR) device.

11. A magnetic recording head comprising the MR device of claim 1.

12. A magnetic recording device comprising the magnetic recording head of claim 11.

13. A magneto-resistive random access memory (MRAM) comprising the MR device of claim 1.

14. A sensor comprising the MR device of claim 1.

15. A giant magnetoresistive (GMR) device, comprising:
   a pre-seed layer comprising an amorphous material;
   a (001) texture seed layer comprising RuAl disposed on the pre-seed layer;
   a free ferromagnetic layer disposed on the (001) texture seed layer;
   a first ferromagnetic (FM1) layer disposed over the free ferromagnetic layer;
   a synthetic antiferromagnetic layer (SAF) spacer layer disposed on the FM1 layer, wherein:
   the SAF spacer layer comprises RuAl, and
   the SAF spacer layer a total thickness in the range of about 7 Å to about 11 Å; and
   a second ferromagnetic (FM2) layer disposed on the SAF spacer layer.

16. The GMR device of claim 15, wherein the FM2 layer comprises:
   at least one BCC-based sublayer;
   at least one HCP/FCC sublayer; and
   an amorphous layer.

17. The GMR device of claim 15, further comprising:
   a GMR spacer layer disposed between the free ferromagnetic layer and the FM1 layer; and
   a FCC antiferromagnetic pinning layer disposed over the FM2 layer.

18. The GMR device of claim 15, further comprising:
   a GMR spacer layer disposed between the free ferromagnetic layer and the FM2 layer; and
   a BCC-type antiferromagnetic layer disposed between the seed layer and the FM1 layer.

19. The GMR device of claim 15, wherein the FM1 layer comprises at least one BCC-based layer, the at least one BCC-based layer comprising a Heusler alloy or a half-Heusler alloy.

20. The GMR device of claim 19, wherein the Heusler alloy is selected from a group consisting of: $Co_2MnSi$, $Co_2MnAl$, $Co_2MnGe$, $Co_2FeSi$, and $Co_2FeAl$.

21. The GMR device of claim 15, wherein the SAF spacer layer has a (001) texture.

22. A sensor comprising the GMR device of claim 15.

23. A tunneling magnetoresistive (TMR) device, comprising:
   a pre-seed layer comprising an amorphous material;
   a (001) texture seed layer comprising RuAl disposed on the pre-seed layer;
   a free ferromagnetic layer disposed on the (001) texture seed layer;
   a tunneling barrier layer disposed on the free ferromagnetic layer; and
   a first ferromagnetic (FM1) layer disposed on the tunneling barrier layer;

a synthetic antiferromagnetic layer (SAF) spacer layer disposed on the FM1 layer, wherein:
  the SAF spacer layer comprises RuAl, and
  the SAF spacer layer has a (001) texture;
a second ferromagnetic (FM2) layer disposed on the SAF spacer layer; and
a pinning layer disposed on the second ferromagnetic (FM2) layer.

24. The TMR device of claim 23, wherein the SAF spacer layer has a thickness about 7 Å to about 11 Å, and wherein the FM1 layer comprises at least one BCC-based layer, the at least one BCC-based layer comprising a Heusler alloy or a half-Heusler alloy.

25. The TMR device of claim 23, wherein the FM2 layer comprises:
  at least one BCC-based sublayer;
  at least one HCP/FCC sublayer; and
  an amorphous layer.

26. The TMR device of claim 23, wherein the amorphous material of the pre-seed layer is selected from a group consisting of: a NiFeTa alloy, a CoFeTa alloy, a CoFeB alloy, a CoFeBTa alloy, and Ta, and wherein the tunneling barrier layer comprises MgO.

27. The TMR device of claim 23, wherein the pinning layer is a FCC antiferromagnetic pinning layer.

28. A magnetic recording head comprising the TMR device of claim 23.

29. A magnetic recording device comprising the magnetic recording head of claim 28.

30. A magneto-resistive random access memory (MRAM) comprising the TMR device of claim 23.

31. A sensor comprising the TMR device of claim 23.

32. A tunneling magnetoresistive (TMR) device, comprising:
  a pre-seed layer comprising an amorphous material;
  a (001) texture seed layer comprising RuAl disposed on the pre-seed layer;
  a pinning layer disposed on the (001) texture seed layer;
  a first ferromagnetic (FM1) layer disposed on the pinning layer;
  a synthetic antiferromagnetic layer (SAF) spacer layer disposed on the FM1 layer, wherein:
    the SAF spacer layer comprises RuAl, and
    the SAF spacer layer has a (001) texture; and
  a second ferromagnetic (FM2) layer disposed on the SAF spacer layer;
  a tunneling barrier layer disposed on the second ferromagnetic (FM2) layer; and
  a free ferromagnetic layer disposed on the tunneling barrier layer.

33. The TMR device of claim 32, wherein the pinning layer is a BCC-type antiferromagnetic layer.

34. The TMR device of claim 32, wherein the FM1 layer is a BCC-based layer, and wherein the FM2 layer is a BCC-based layer.

35. The TMR device of claim 32, wherein the SAF spacer layer has a thickness about 7 Å to about 11 Å.

36. A magnetic recording head comprising the TMR device of claim 32.

37. A magnetic recording device comprising the magnetic recording head of claim 36.

38. A magneto-resistive random access memory (MRAM) comprising the TMR device of claim 32.

39. A sensor comprising the TMR device of claim 32.

* * * * *